United States Patent [19]

Calderbank

[11] Patent Number: 5,377,194
[45] Date of Patent: Dec. 27, 1994

[54] MULTIPLEXED CODED MODULATION WITH UNEQUAL ERROR PROTECTION

[75] Inventor: Arthur R. Calderbank, Maplewood, N.J.

[73] Assignee: AT&T Corp., Murray Hill, N.J.

[21] Appl. No.: 809,626

[22] Filed: Dec. 16, 1991

[51] Int. Cl.⁵ .............................................. H04J 3/12
[52] U.S. Cl. ........................ 370/110.1; 370/110.4; 370/112; 370/20; 375/39; 371/37.1
[58] Field of Search ............... 371/37.1, 2.1, 30, 17, 371/43, 37, 38, 39, 50; 370/57, 12, 79, 82–83, 110.1, 112, 20, 110.4; 375/39, 42, 38; 358/133

[56] References Cited

U.S. PATENT DOCUMENTS

| | | | |
|---|---|---|---|
| 4,110,735 | 8/1978 | Maxemchuk | 371/43 |
| 4,119,945 | 10/1978 | Lewis et al. | 371/43 |
| 4,369,512 | 1/1983 | Brossard et al. | 371/43 |
| 4,933,934 | 6/1990 | Aikoh et al. | 370/112 |
| 4,993,046 | 2/1991 | Saito et al. | 371/43 |
| 5,052,000 | 9/1991 | Wang et al. | 371/43 |
| 5,105,442 | 4/1992 | Wei | 375/39 |
| 5,105,443 | 4/1992 | Betts et al. | 370/110.1 |
| 5,107,504 | 4/1992 | Nakamura et al. | 371/37.1 |
| 5,113,401 | 5/1992 | Chevillat et al. | 371/43 |
| 5,130,985 | 7/1992 | Kondo et al. | 370/94.1 |

*Primary Examiner*—Douglas W. Olms
*Assistant Examiner*—Chau T. Nguyen
*Attorney, Agent, or Firm*—Joseph J. Opalach

[57] ABSTRACT

In a time-division multiplexing communications system, which transmits information from various sources in different time-slots, additional information is transmitted by varying the pattern of time slot assignments in accordance with a set of rules. As a result, the assignment pattern by which time slots are assigned to each of the various sources of information, conveys additional information. Specifically, a High Definition Television (HDTV) transmission system is constructed in which picture information is transmitted by time-division-multiplexing between two different, and disjoint, signal point constellations. Additional information is conveyed by the rule for switching between the different signal point constellations.

26 Claims, 6 Drawing Sheets

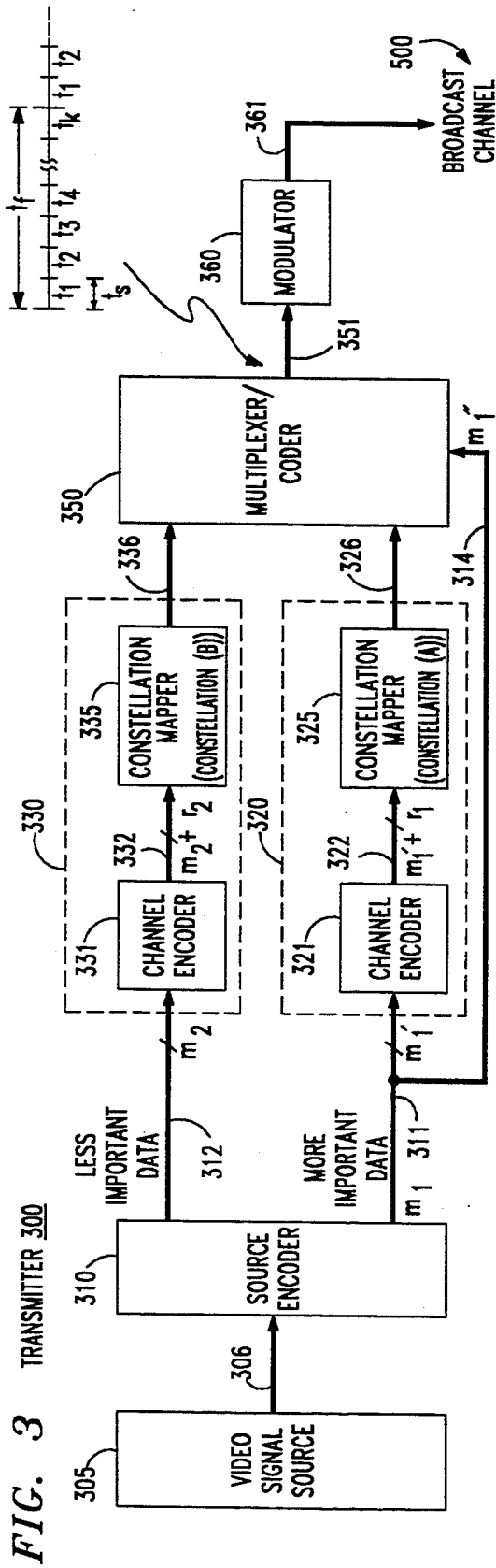
FIG. 3 TRANSMITTER 300
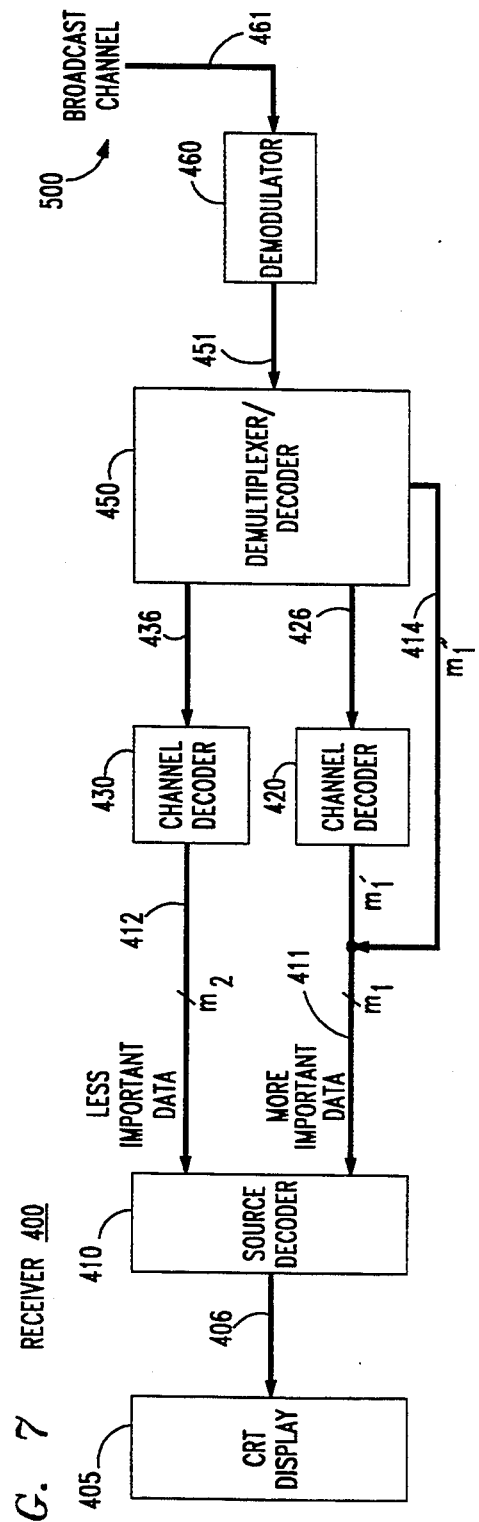
FIG. 7 RECEIVER 400

FIG. 6

CODEBOOK

| $m_1''$ | RULE |
|---|---|
| 0 0 0 0 | B B B B B B B A B B A A |
| 0 0 0 1 | B B B B B B A B B A A B |
| 0 0 1 0 | B B B B B A B B A A B B |
| 0 0 1 1 | B B B B A B B A A B B B |
| 0 1 0 0 | B B B A B B A A B B B B |
| 0 1 0 1 | B B A B B A A B B B B B |
| 0 1 1 0 | B A B B A A B B B B B B |
| 0 1 1 1 | A B B A A B B B B B B B |
| 1 0 0 0 | B B B B A B B B B A B A |
| 1 0 0 1 | B B B A B B B B A B A B |
| 1 0 1 0 | B B A B B B B A B A B B |
| 1 0 1 1 | B A B B B B A B A B B B |
| 1 1 0 0 | A B B B B A B A B B B B |
| 1 1 0 1 | B B B A B A B B B B B A |
| 1 1 1 0 | B B A B A B B B B B A B |
| 1 1 1 1 | B A B A B B B B B A B B |

MULTIPLEXED CODED MODULATION WITH UNEQUAL ERROR PROTECTION

BACKGROUND OF THE INVENTION

This invention relates to the transmission of digital data, particularly the transmission of digital data that represents video signals.

An HDTV transmission system will provide HDTV images with much greater resolution than the existing NTSC (National Television System Committee) television (TV) image. However, any HDTV transmission system is currently required to use the existing NTSC TV 6 MHz channel allocations, which are in the VHF (Very High Frequency) and UHF (Ultra High Frequency) bands. As a result, an HDTV image, which contains more picture information than an NTSC image, to provide the increased resolution, must be compressed in order to fit within an NTSC TV channel. Since much more powerful video compression schemes can be implemented with digital signal processing than with analog signal processing, it is possible that some form of digital transmission system will be required for an HDTV image so that the above transmission constraint can be met. However, there has been some concern about becoming committed to an all-digital transmission system because of the potential sensitivity of digital transmission to small variations in signal-to-noise ratio at the various receiving locations. This sensitivity can result in a quick degradation in performance, which is generally not considered acceptable by the TV broadcast industry. By comparison, the degradation in performance for presently used NTSC TV transmission is much more graceful.

The co-pending, commonly assigned U.S. patent of H. Y. Chung et al. entitled "Multiplexed Coded Modulation with Unequal Error Protection," Ser. No. 07/627,156, U.S. Pat. No. 5,214,656, filed on Dec. 13, 1990, discloses an advantageous technique for overcoming the shortcomings of standard digital transmission by providing for graceful degradation of over-the-air broadcasting of digital TV signals. Specifically, a digital HDTV signal is characterized into classes of "more important" and "less important" information (i.e., different classes of information), which are then transmitted during a time-frame by time-division-multiplexing between different coded modulation schemes for each class of information. Each time-frame comprises a number of time-slots, each of which is particularly assigned to either the more important information or the less important information. The particular coded modulation scheme for each class of information is chosen so that the more important information is provided with a higher amount of error protection than the less important information. This approach provides unequal error protection for the more important information, and allows a graceful degradation in reception quality at the TV set location because, as the bit-error rate at the receiver begins to increase with increasing distance from the broadcast transmitter, it will be the less important information of the TV signal information that will be the first affected.

In the time-division-multiplexing communications system disclosed above, the overall amount of information that is transmitted in a time-frame is dependent upon how many time-slots are assigned to the more important information and the less important information. Typically, the time-slots that are assigned to the less important information carry more image data, although with less error protection and, conversely, the time-slots that are assigned to the more important information carry less image data, although with higher error protection. Unfortunately, the overall amount of picture information in an HDTV signal is generally proportional to the complexity of each HDTV image that is transmitted, i.e., the amount of picture information that is considered to be more important and less important is variable. As a result, it may be desirable to increase the amount of more important information that can be transmitted. This is achieved in the above-mentioned Chung et al. approach by increasing the number of time-slots that are assigned to the more important information in any time-frame. Consequently, there are fewer time-slots available for the less important information and either some less important information must be dropped (with, hopefully, only a small decrease in picture quality), or the channel capacity must be increased by increasing the amount of less important information that is transmitted in each time-slot assigned to the less important information. The latter generally results in an increase in the size of the signal point constellation used to represent the less important information. Unfortunately, as the size of the signal point constellation increases either the average power level required to transmit the constellation increases, or, if the power level is constrained by system requirements, the amount of error protection provided by the constellation decreases.

Before proceeding with a description of an illustrative embodiment, it should be noted that the various digital signaling concepts described herein—with the exception, of course, of the inventive concept itself—are all well known in, for example, the digital radio and voiceband data transmission (modem) arts and thus need not be described in detail herein. These include such concepts as multidimensional signaling using 2N-dimensional channel symbol constellations, where N is some integer; trellis coding; fractional coding; scrambling; passband shaping; equalization; Viterbi, or maximum-likelihood, decoding; etc.

SUMMARY OF THE INVENTION

As noted above, in a communications system that employs multiplexing techniques and assigns different portions of the channel's information capacity to each one of a number of information sources, the total amount of information that can be transmitted is fixed and is equal to the sum of the amounts of information that can be transmitted in each assigned portion of the channel's capacity. In accordance with the invention, additional information is transmitted in a multiplexing scheme by varying the pattern of channel assignments in accordance with a set of rules. As a result, the assignment pattern itself, i.e., what portion of the channel's capacity is assigned to each of the different sources of information, conveys additional information. Consequently, the channel capacity itself is increased without increasing the average power level of, or decreasing the amount of error protection provided to, the different sources of information.

In an embodiment of the invention, an HDTV transmission system is constructed in which unequal error protection is provided by time-division-multiplexing between two different, and disjoint, signal point constellations. Additional information, such as more "more important information," is conveyed by the rule for switching between the different signal point constellations.

BRIEF DESCRIPTION OF THE DRAWING

FIG. 3 is a block diagram of an HDTV transmitter embodying the principles of the invention;

FIG. 6 is an illustrative codebook table of constellation assignments used in the transmitter of FIG. 3;

FIG. 7 is a block diagram of an HDTV receiver embodying the principles of the invention;

DETAILED DESCRIPTION

Figure 1:
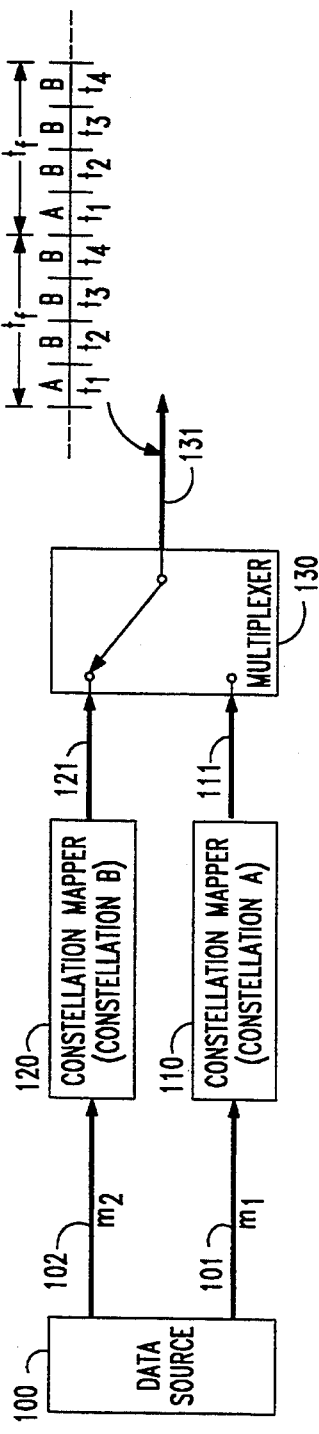
FIG. 1 is a block diagram of a general time-division-multiplexing transmission scheme.

Before proceeding with a detailed description of an embodiment of the invention, the general inventive concept is discussed. In FIG. 1, a simplified time-division-multiplexing scheme is illustrated (a more detailed description can be found in the above-mentioned Chung et al. patent application). Data source 100 provides two data streams on leads 101 and 102, where each data stream respectively comprises an average of $m_1$ and $m_2$ bits per assigned signaling interval T (discussed below). Data stream $m_1$ is mapped to a signal point from constellation A by constellation mapper 110 in each assigned signaling interval. Similarly, data stream $m_2$ is mapped to a signal point from constellation B by constellation mapper 120, in each assigned signaling interval. The assigned signaling intervals are determined by multiplexer 130, which operates over time-frame $t_f$. In this example, each assigned signaling interval is a time-slot from time-frame, $t_f$, i.e., $t_1$, $t_2$, $t_3$ and $t_4$. Further, multiplexer 130 assigns one time-slot, e.g., $t_1$, to constellation mapper 110 and the remaining three time-slots, $t_2$, $t_3$ and $t_4$, to constellation mapper 120 in each time-frame. As a result, the output from multiplexer 130, that is provided on lead 131 to a transmitter (not shown), is a time-division-multiplexed sequence of signal points from respective constellations A and B. Alternatively, the output is a repetitive pattern of constellation assignments even though the individual signal points in any particular time-slot will vary. In this example, the repeating constellation pattern is A ,B ,B ,B, where 25% of the time-frame is allocated to data stream $m_1$ as represented by those signal points taken from constellation A. If it was desired to allocate another time-slot, $t_s$, of the time-frame, $t_f$, to data stream $m_1$ at the expense of a time-slot previously designated to data stream $m_2$, then either less information from data stream $m_2$ is transmitted (since there is one less time-slot), or the constellation B must be increased in size to accommodate the increase in information then contained in each remaining time-slot assigned to data stream $m_2$. Unfortunately, as the size of the signal point constellation increases either the average power level required to transmit constellation B increases, or, if the power level is constrained by system requirements, the amount of error protection provided by constellation B to data stream $m_2$ decreases. However, and in accordance with the invention, additional information can be transmitted in time-frame $t_f$ without increasing the average power level or decreasing the amount of error protection provided to the different data streams. The additional information is transmitted by varying the pattern of time-slot assignments in accordance with a set of rules.

Figure 2:
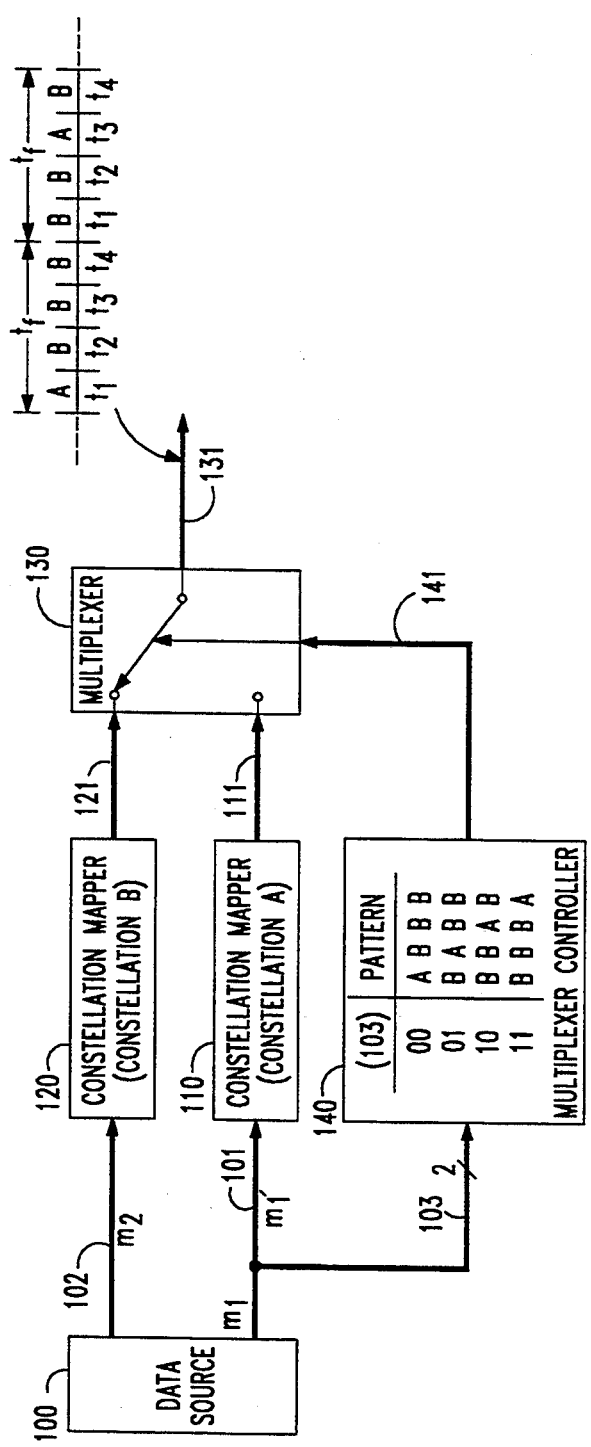
FIG. 2 is a block diagram of a general time-division-multiplexing transmission scheme embodying the principles of the invention.

The inventive concept is shown in FIG. 2, which is the same as FIG. 1 except for the addition of multiplexer controller 140. As described above, it is assumed that 25% of every time-frame is allocated to information represented by signal points from constellation mapper 110. As shown in FIG. 2, data stream $m_1$ is divided into two data streams: $m'_1$, which is applied to constellation mapper 110; and two bits, which are applied to multiplexer controller 140, via lead 103. The two bits on lead 103 are used by multiplexer controller 140 to chose one of four rules for assigning the four time-slots in each time-frame, as shown in FIG. 2. As a result, and in accordance with the invention, the two bits on lead 103 are encoded by the selection of the particular pattern that is used by multiplexer 130 in assigning the time-slots to a particular constellation. Advantageously, this allows either an additional two bits of information to be sent from data stream $m_1$ in any particular time-frame, or, constellation A can be reduced in size, thereby reducing the average amount of power required to transmit constellation A and increasing the error protection provided by constellation A to data stream $m_1$.

Having described the general inventive concept, a more detailed embodiment will now be described. FIG. 3 shows an illustrative HDTV transmitter in which the inventive concept is implemented. Video signal source 305 generates an analog video signal representing picture information. This HDTV analog video signal is passed on to source encoder 310, which generates a digital signal comprising a plurality of "classes of information" in which at least one class of information is more important, i.e., contains "more important data," than the remainder of the classes of information that, therefore, contain "less important data." For example, the more important data represents that information that is more important for the reception of the information signal. In an HDTV signal, it is that information, which, if properly received, will form a rough picture, e.g., audio information, framing information, etc., and the less important data represents the information that comprises the remainder of the HDTV signal. As represented herein, source encoder 310 illustratively provides two classes of information with the class of information on lead 311 being "more important" and the class of information on lead 312 being "less important." Illustratively, each class of information comprises a plurality of data bits, with an average of $m_i$ bits, $1 \leq i \leq 2$, being generated on each lead for each assigned signaling interval (discussed below), which is of duration T seconds. A more detailed example of providing different classes of information is also shown in the co-pending, commonly assigned U.S. patent application of J. D. Johnston et al. entitled "A High Definition Television Coding Arrangement with Graceful Degradation," Ser. No. 07/625,349, U.S. Pat. No. 5,128,756 filed on Dec. 12, 1990.

As shown in FIG. 1 the less important data, $m_2$, on lead 312 is applied to channel encoder 331, which operates in accordance with known encoding techniques, e.g., trellis-coding. The encoded output of channel encoder 331, on lead 332, consists of $m_2+r_2$ data bits, where $r_2$ represent the average number of redundant bits introduced by channel encoder 331 in each signaling interval assigned by multiplexer/coder 350. The encoded output of channel encoder 331 is mapped to a signal point from constellation B, for each assigned signaling interval, by constellation mapper 335 to provide a sequence of signal points on lead 336, which is applied to multiplexer/coder 350. Similarly, a fraction of the more important information, $m'_1$, is applied to channel encoder 321, which provides an encoded output of $m'_1+r_1$ data bits, via lead 322, to constellation mapper 325. The latter provides a sequence of signal points taken from constellation A to multiplexer/coder 350 via lead 326.

The data that is broadcast over channel 500 is broadcast in "broadcast frame" sections, such as in NTSC frames, $t_f$. In the illustrative embodiment described herein, $t_f$ is divided into k time-slots, which are used to transmit the HDTV information. The separate signal point sequences provided on leads 336 and 326 are time-division-multiplexed by multiplexer/coder 350 in accordance with the principles of the invention (discussed below) to provide a sequence of multiplexed signal points in every time-frame $t_f$ to modulator 360. The later is representative of conventional modulation circuitry for transmission of the broadcast HDTV signal on broadcast channel 500. For the purposes of this example, it is assumed that there is one signal point for every time-slot contained within a time-frame, $t_f$, and that quadrature-amplitude modulation (QAM) is used.

Figure 4:
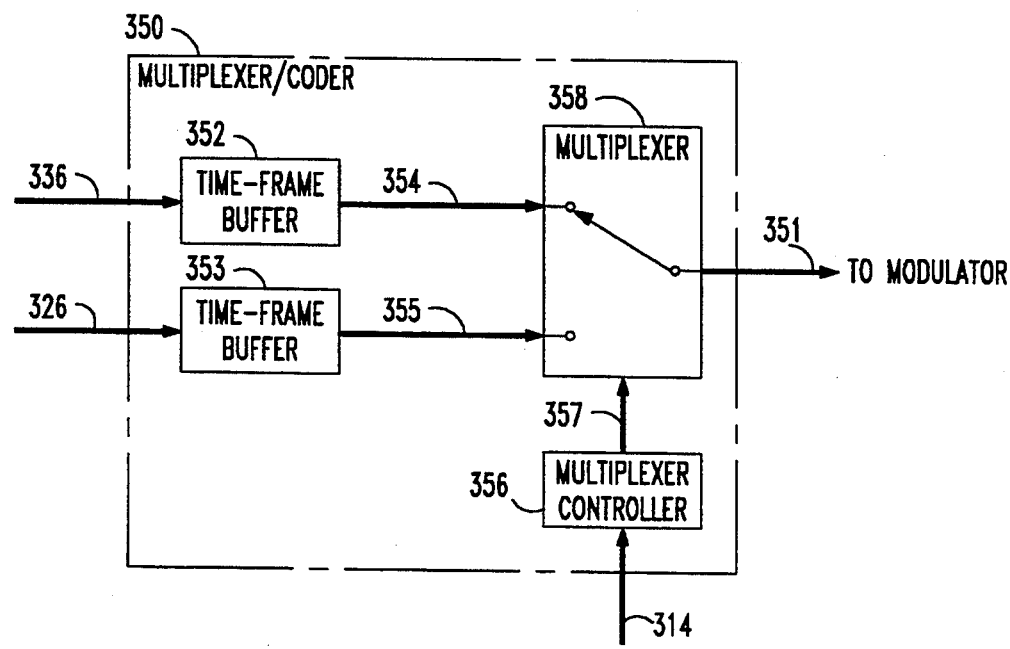
FIG. 4 is a block diagram of multiplexer/coder 350 used in the transmitter of FIG. 3.

In accordance with the invention, the particular pattern, or sequence, of time-slot assignments that occurs in any time-frame, $t_f$, is the result of the application of a "codebook," or rule, to a particular time-frame. As noted above, only a fraction of the $m_1$ data bits, i.e., $m'_1$, is applied to channel encoder 321. The remaining portion, $m''_1$, is applied, via lead 314, to multiplexer/coder 350, which is shown in block diagram form in FIG. 4. Multiplexer/coder 350 comprises time-frame buffers 352 and 353, multiplexer controller 356, and multiplexer 358. Time-frame buffer 352 buffers the signal points received from constellation mapper 335, via lead 336, from which the signal points are removed by multiplexer 358 via lead 354. Similarly, time-frame buffer 353 buffers the signal points received from constellation mapper 326, via lead 326, from which the signal points are removed by multiplexer 358 via lead 355. Multiplexer 358 operates under the control of multiplexer controller 356, via lead 357, and provides a time-division-multiplexed sequence of signal points on lead 351 to modulator 360 (discussed above). The particular multiplexing pattern used by multiplexer 358 is determined by multiplexer controller 356 in response to $m''_1$ applied via lead 314. The bits represented by $m''_1$ select a particular rule, i.e., sequence or pattern, of constellation assignments in every time-frame $t_f$. Since information is being represented by the particular sequence of time-slot assignments between the more important information and the less important information, in accordance with a feature of the invention, signal point constellations A and B are chosen so that the receiver (discussed below) can discriminate which constellation is being received by deciding which signal point is received.

Figure 5:
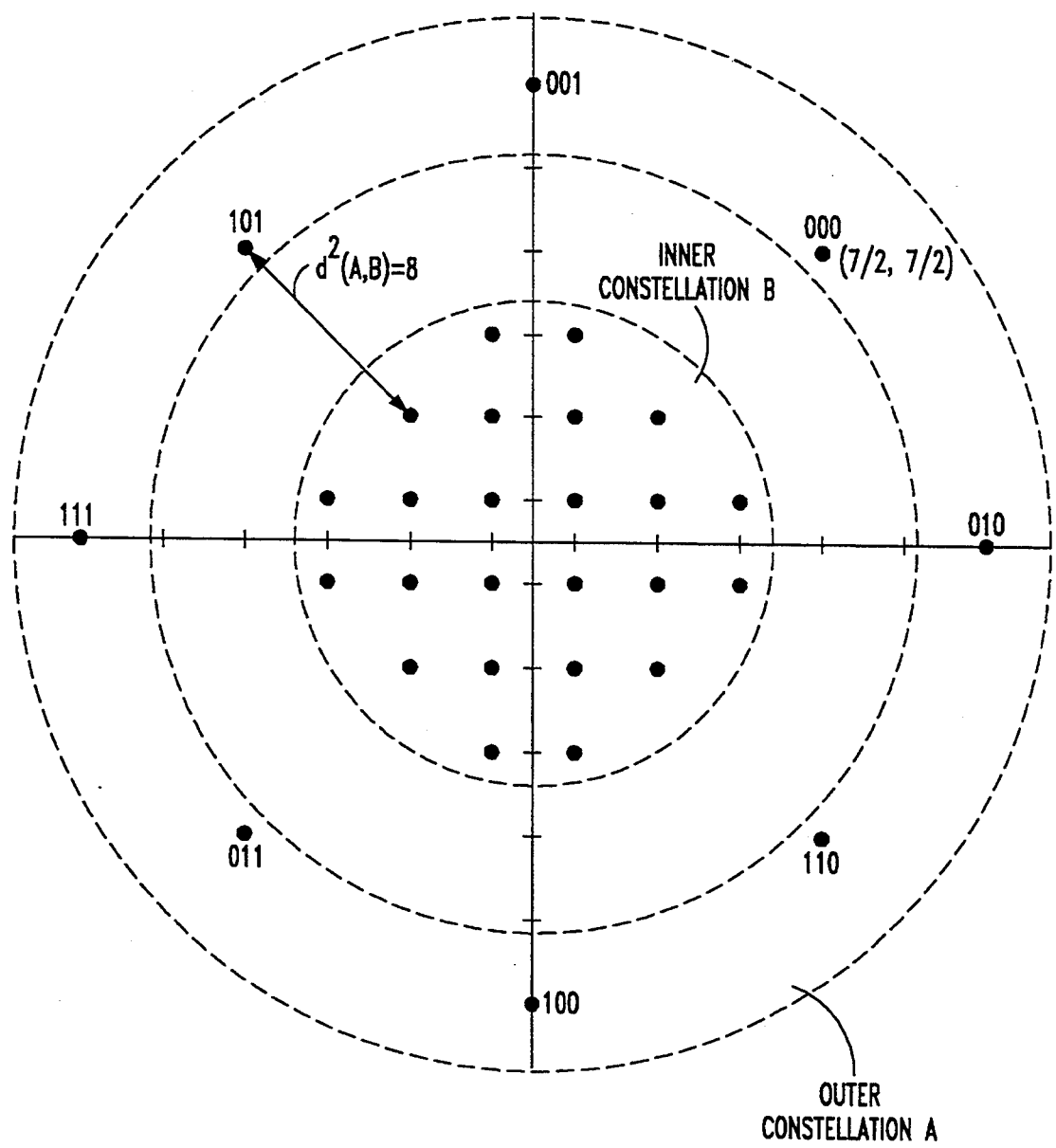
FIG. 5 is an illustrative signal point constellation used in the transmitter of FIG. 3.

An illustrative pair of signal point constellations A and B are shown in FIG. 5. Each signal point has an in-phase, or I, coordinate on the horizontal axis and has a quadrature-phase, or Q, coordinate on the vertical axis. On each axis, the signal point coordinates are $\pm\frac{1}{2}, \pm 3/2, \pm 5/2, \pm 7/2, \pm 9/2$, and $\pm 11/2$. As shown in FIG. 5, the "inner constellation," B, is separate from the "outer constellation," A, i.e., constellations A and B are "disjoint" constellations, i.e., the signal points from either constellation do not overlap. This separation allows a receiver to discriminate between the signal points representing constellations A and B so that the receiver can determine the particular constellation that the signal point was taken from in any particular time-slot of a time-frame, $t_f$. The amount of separation of the two constellations determines the ability for the receiver to successfully discriminate between constellations. This separation is determined by $d^2(A,B)$, which is the minimum squared Euclidean distance separating the two constellations. An illustration of the separation between these constellations is shown in FIG. 5, in which $d^2(A,B)=8$.

Continuing with the example represented by FIG. 3, it is further assumed that the number of time-slots, k, in any time-frame, $t_f$, is equal to 12. In any time-frame, $m''_1$ is equal to 4 bits, $m'_1$ is equal to 8 bits, and $m_2$ is equal to 36 bits. Since the number of bits represented by $m''_1$ is equal to four bits, there are 16 possible rules that can be applied to the time-slot assignment of the more important information and the less important information in any particular time-frame. FIG. 6 is representative of a particular set of codebook assignments. From this codebook, in any time-frame, three of the time-slots, or 25% of the time-frame, are assigned to the more important data.

It is assumed that channel encoder 321 is a simple form of trellis code, e.g., a parity check, which adds 1 bit in every time-frame. As a result, the average data rate from channel encoder 321, $m'_1+r_1$ is equal to 9 bits every 12 signaling intervals. From FIG. 5, it can be seen that each signal point in constellation A, or symbol, is labeled by a binary three-tuple, i.e., 3 bits. Consequently, the 9 bits applied to constellation mapper 325 select three signal points in any time-frame as required by the codebook of FIG. 6.

The average data rate from channel encoder 331, $m_2+r_2$, is equal to 40.5 bits over 12 signaling intervals. It is assumed that channel encoder 331 is a rate $\frac{3}{4}$ trellis coder, where one redundant bit is added every two signalling intervals. To handle an integral number of bits, time-frame buffers 352 and 353 can be simply modified to buffer data over twenty-four time slots. An illustrative trellis coder is shown in the above-mentioned Chung et al. patent application. Since three of the signalling intervals in any time-frame are assigned to the more important data represented by constellation A, the remaining 9 time-slots are assigned to the less important data represented by signal points from constellation B.

As can be seen from the above discussion, the data stream is divided into 3 bits streams and encoded as a sequence with the result that 48 bits select 12 signal points in any particular time-frame. In addition, the average signal power required to transmit the above-mentioned time-division-multiplexing scheme is equal to:

$$P=f_0 P_A + f_1 P_B,$$

where $P_A$ and $P_b$ represent the average signal power to transmit the constellations A and B, respectively, and $f_0$ and $f_1$ represent the frequency with which the constellations A and B are respectively used to transmit the information signal. Since $P_A > P_B$, the average signal power is reduced by using constellation B more frequently than constellation A. In the example above, $P_A = 219/16$, $P_B = 23/12$, $f_0 = \frac{1}{4}$, and $f_1 = \frac{3}{4}$.

The broadcast HDTV signal is received from broadcast channel 500 by receiver 400, which is shown in FIG. 7. The broadcast HDTV signal is received by demodulator 460, which is representative of conventional synchronization to time-frame, $t_f$, reception and demodulation circuitry, e.g., the antenna, demodulation, analog-to-digital conversion, etc. Demodulator 460 provides the sequence of received symbols in each time-frame, $t_f$, to demultiplexer/decoder 450. (As used herein, a received symbol represents the transmitted signal point plus any corruption due to noise). The latter demultiplexes the received symbol sequence (discussed below) to provide the sequence of received symbols representing the more important information to channel decoder 420, via lead 426, and the sequence of received symbols representing the less important information to channel decoder 430, via lead 436. Channel decoders 420 and 430 decode the received symbols, e.g., using maximum likelihood detection, to provide the more important and less important information to source decoder 410 via leads 411 and 412, respectively. In addition, demultiplexer/decoder 450 recovers those data bits that were encoded by the particular rule that was used to transmit the time-frame of information and recombines them, via lead 414, with the more important data on lead 411 for application to source decoder 410, which provides the inverse function of source encoder 310 of HDTV transmitter 300, to provide the received HDTV signal to display 405.

Figure 8:
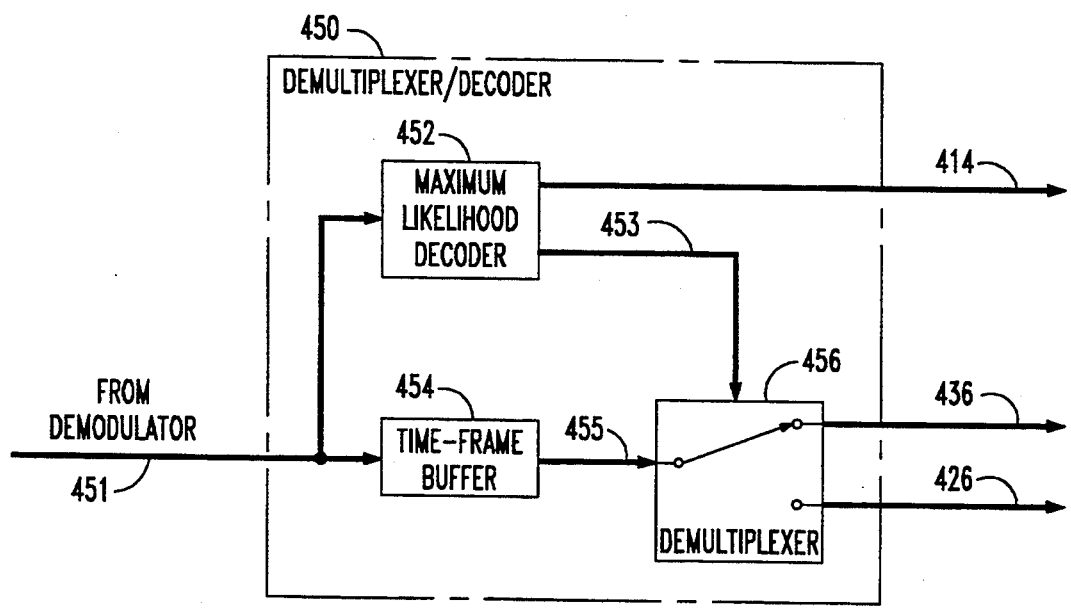
FIG. 8 is a block diagram of demultiplexer/decoder 450 used in the receiver of FIG. 7.
Figure 9:
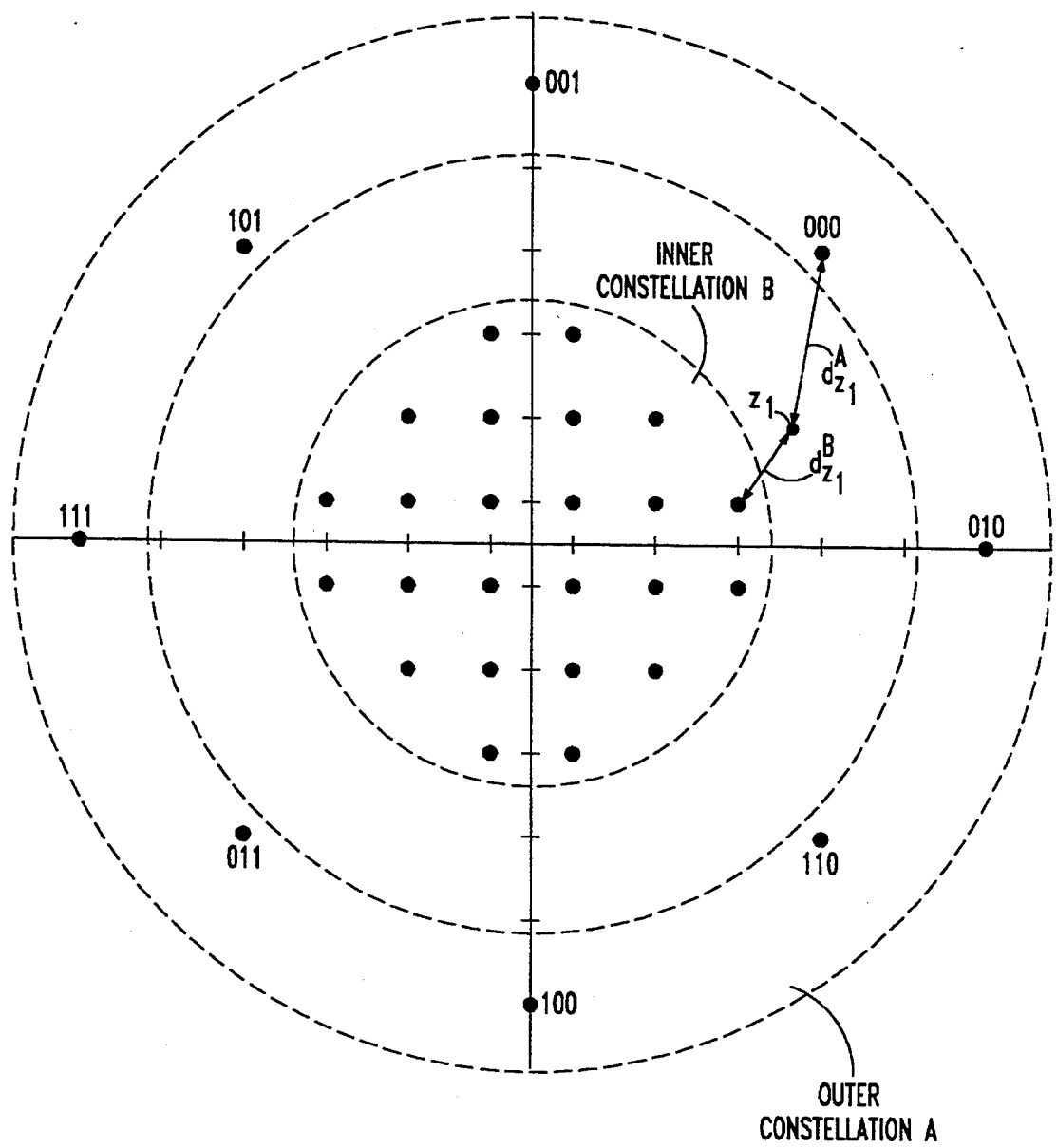
FIG. 9 is an illustrative diagram of a distance vector used in the receiver of FIG. 7.

As noted above, demultiplexer/decoder 450 must be able to make a decision as to the rule that is to be used in demultiplexing the received sequence of symbols in any particular time-frame. Demultiplexer/decoder 450, which is shown in FIG. 8, comprises maximum likelihood decoder 452, time-frame buffer 454 and demultiplexer 456. Maximum likelihood decoder 452 implements maximum likelihood detection similar to channel decoders 420 and 430, but applied here to the set of rules that form the codebook as illustrated by FIG. 6. In this particular method, maximum likelihood decoder 452 forms a decision matrix in which for each received symbol that is received in a time-frame, $t_f$, a metric is calculated for each of the rules in the codebook of FIG. 6. For example, each received symbol is represented by its "x-coordinate" and "y-coordinate" in the signal space, i.e., the signal point constellation. (It should be remembered, that the synchronization of the time-frame is performed by demodulator 460, i.e., demultiplexer/decoder 450 already knows what time-slot the received symbol is assigned to.) Assume that a received symbol, $z_1$, for time-slot, $t_1$, is received. Maximum likelihood decoder 452 will measure the distance that the received symbol, $z_1$, is from constellation A and constellation B. This distance is represented the distance vectors $d_{z1}^A$ and $d_{z1}^B$, respectively. This is shown in FIG. 9. Similarly, for each other symbol received in the respective time-slot of the time-frame, two distance vectors will be calculated representing the distance that the received symbol is from constellations A and B. From these distance vectors, a metric can then be determined for each rule in the codebook by maximum likelihood decoder 452. Specifically, for each rule, the corresponding distance vector is substituted in the appropriate time-slot. For example, in rule one of FIG. 6, constellation A is transmitted in time-slots $t_8$, $t_{11}$ and $t_{12}$. Therefore, in these time-slots the distance vector will be equal to the distance from constellation A for the respective received symbol. Similarly, the distance vector from constellation B will be used for the remaining time-slots and respective received symbols. The square of the distances from all the time-slots are then added together to generate the respective metric for that rule. The rule with the smallest metric will be chosen as the rule to be used to demultiplex the received time-frame and also for recovering the bits that are represented by the selected rule.

The received symbols are applied to maximum likelihood decoder 450 via lead 451 and are also applied to time-frame buffer 454. The latter stores the received sequence of symbols while maximum likelihood decoder 452 is determining the rule to be used in demultiplexing the received sequence of symbols. Once having determined the rule to be used for a particular time-frame, maximum likelihood decoder 452 controls demultiplexer 456, via lead 453, in accordance with the selected rule. Demultiplexer 456 reads out the sequence of received symbols from time-frame buffer 454, via lead 455, and provides the demultiplexed sequence of received symbols on leads 436 and 426. In addition, once have determined the rule to be used maximum likelihood decoder 452 provides the remaining portion of data bits on lead 414.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, although the encoding schemes were illustrated with two-dimensional signal points, 2N-dimensional signal points can also be used, where $N > 1$. Similarly, more than two classes of information can be used. Also, the inventive concept can be applied to other multiplexing systems and other communications systems, e.g., cellular mobile radio. Finally, the data may also be source encoded (e.g., Reed/Solomon encoding), scrambled, and other forms of channel encoding can also be used, e.g., multi-level coding.

In addition, although the invention is illustrated herein as being implemented with discrete functional building blocks, e.g., buffers, formatters, etc., the functions of any one or more of those building blocks can be carried out using one or more appropriate programmed processors.

I claim:

1. A method for multiplexing comprising the steps of
   a) receiving an information signal,
   b) processing the information signal into a first data stream and a plurality of data streams,
   c) selecting one of a plurality of multiplexing rules as a function of said first data stream, and
   d) sending information conveyed by the first data stream by multiplexing ones of the plurality of data streams in accordance with said selected rule.

2. The method of claim 1 wherein the sending step time-division-multiplexes the ones of the plurality of data streams.

3. The method of claim 2 wherein at least one of the data streams represents information that is more important for reception of the information signal.

4. The method of claim 1 wherein the sending step d) includes the steps of
   e) channel encoding each one of the plurality of data streams,
   f) mapping individual ones of each one of the channel encoded plurality of data streams to a signal point from at least one constellation of signal points to provide a plurality of signal points for each channel encoded data stream, and
   g) multiplexing between each plurality of signal points in accordance with said rule.

5. The method of claim 4 wherein at least one signal point is taken from a constellation of signal points that is disjoint from another constellation of signal points.

6. A method for processing an HDTV signal, the HDTV signal comprising a first data stream and a plurality of data streams, each data stream representing a class of information, comprising the steps of
   selecting one of a plurality of multiplexing rules as a function of a portion of the first data stream,
   separately coding the ones of the plurality of data streams and the remaining portion of the first data stream to provide a plurality of coded outputs, and where one of the coded outputs has more error protection than the remaining ones of the plurality of coded outputs, and
   multiplexing the coded outputs in accordance with said selected rule.

7. The method of claim 6 where the multiplexing step is time-division-multiplexing.

8. The method of claim 7 wherein the multiplexing step includes the step of assigning each one of the plurality of coded outputs to a time interval in a time frame in accordance with said selected rule, the time frame being greater than or equal to the sum of the plurality of assigned time intervals.

9. The method of claim 6 wherein the separately coding step includes the steps of
   encoding each one of the plurality of data streams and the remaining portion of the first data stream to provide a plurality of encoded outputs, and
   mapping individual ones of each one of the plurality of encoded outputs to a signal point of a signal constellation to provide the plurality of coded outputs, where each one of the plurality of coded outputs comprises a plurality of signal points.

10. The method of claim 9 wherein at least the signal points of two of said plurality of coded outputs are taken from signal point constellations that are disjoint with respect to each other.

11. A method for providing unequal error protection for an information signal, the information signal comprising a plurality of data streams, each data stream representing a class of information, comprising the steps of
    assigning each one of the plurality of data streams to a coded modulation scheme, where at least one of the plurality of data streams is assigned to a different coded modulation scheme than the remaining ones of the plurality of data streams, and
    separately coding each one of the plurality of data streams using the assigned coded modulation scheme in an assigned time interval to provide a coded output for transmission, where at least one of the plurality of data streams has more error protection than the remaining ones of the plurality of data streams;
    where the assigned time interval is a function of one of a number of rules, said one of the number of rules being selected by a portion of one of the plurality of data streams.

12. A method for decoding a received signal, the received signal being comprised of a plurality of coded outputs, each one of the plurality of coded outputs representing a class of information and where at least one class of information is provided more error protection than the remaining ones of the plurality of classes of information, the method comprising the steps of
    decoding the received signal to select one of a plurality of rules for demultiplexing the received signal,
    demultiplexing the received signal in accordance with said selected rule, to provide a plurality of coded outputs,
    separately decoding each one of the plurality of coded outputs using a separate decoding scheme to provide each one of a plurality of data streams, each data stream representing the respective class of information, and
    source decoding the plurality of data streams to provide an information signal.

13. The method of claim 12 wherein the step of decoding the received signal includes the steps of
    calculating an error measurement for each of the plurality of coded outputs for each one of the plurality of rules,
    adding together the error measurements for each one of the demultiplexing rules to provide a metric, and
    selecting the demultiplexing rule with the smallest metric.

14. Apparatus for multiplexing comprising
    means for receiving an information signal,
    means for processing the information signal to provide a first data stream and a plurality of data streams,
    means for selecting one of a plurality of multiplexing rules as a function of said first data stream, and
    multiplexing means for sending information conveyed by the first data stream by multiplexing the ones of the plurality of data streams in accordance with said selected rule.

15. The apparatus of claim 14 wherein the multiplexing means time-division-multiplexes the ones of the plurality of data streams.

16. The apparatus of claim 15 wherein at least one of the data streams represents information that is more important for reception of the information signal.

17. The apparatus of claim 14 wherein the multiplexing means includes
    means for channel encoding each one of the plurality of data streams,
    means for mapping individual ones of each one of the channel encoded plurality of data streams to a signal point from at least one constellation of signal points to provide a plurality of signal points for each channel encoded data stream, and
    a multiplexer, for multiplexing said between each plurality of signal points in accordance with said rule.

18. The apparatus of claim 17 wherein at least one signal point is taken from a constellation of signal points that is disjoint from another constellation of signal points.

19. Apparatus for processing an HDTV signal, the HDTV signal comprising a first data stream and a plurality of data streams, each data stream representing a class of information, the apparatus comprising means for selecting one of a plurality of multiplexing rules as a function of a portion of said first data stream, means for separately coding the ones of the plurality of data streams and the remaining portion of the first data stream to provide a plurality of coded outputs, and where one of the coded outputs has more error protection than the remaining ones of the plurality of coded outputs, and means for multiplexing the coded outputs in accordance with said selected rule.

20. The apparatus of claim 19 wherein the means for multiplexing time-division-multiplexes the coded outputs.

21. The apparatus of claim 20 wherein the means for multiplexing includes means for assigning each one of the plurality of coded outputs to a time interval in a time frame in accordance with said selected rule, the time frame being greater than or equal to the sum of the plurality of assigned time intervals.

22. The apparatus of claim 19 wherein the means for separately coding includes means for encoding each one of the plurality of data streams and the remaining portion of the first data stream to provide plurality of encoded outputs, and means for mapping individual ones of each one of the plurality of encoded outputs to a signal point of a signal constellation to provide the plurality of coded outputs, where each one of the plurality of coded outputs comprises a plurality of signal points.

23. The apparatus of claim 22 wherein at least two of said plurality of coded outputs are taken from signal point constellations that are disjoint with respect to each other.

24. Apparatus for providing unequal error protection for an information signal, the information signal comprising a plurality of data streams, each data stream representing a class of information, the apparatus comprising means for assigning each one of the plurality of data streams to a coded modulation scheme, where at least one of the plurality of data streams is assigned to a different coded modulation scheme than the remaining ones of the plurality of data streams, and means for separately coding each one of the plurality of data streams using the assigned coded modulation scheme in an assigned time interval to provide a coded output for transmission, where at least one of the plurality of data streams has more error protection than the remaining ones of the plurality of data streams;

where the assigned time interval is a function of one of a number of rules, said one of the number of rules being selected by a portion of one of the plurality of data streams.

25. Apparatus for decoding a received signal, the received signal being comprised of a plurality of coded outputs, each one of the plurality of coded outputs representing a class of information and where at least one class of information is provided more error protection than the remaining ones of the plurality of classes of information, the apparatus comprising means for decoding the received signal to select one of a plurality of rules for demultiplexing the received signal, means for demultiplexing the received signal in accordance with said selected rule to provide a plurality of coded outputs, means for separately decoding each one of the plurality of coded outputs using a separate decoding scheme to provide each one of a plurality of data streams, each data stream representing a respective class of information, and means for source decoding the plurality of data streams to provide an information signal.

26. The apparatus of claim 25 wherein the means for decoding the received signal calculates an error measurement for each of the plurality of coded outputs for each one of the plurality of rules, adds together the error measurements for each one of the demultiplexing rules to provide a metric, and selects the demultiplexing rule with the smallest metric.

* * * * *